United States Patent [19]

Wittry

[11] 4,194,123

[45] Mar. 18, 1980

[54] LITHOGRAPHIC APPARATUS

[75] Inventor: David B. Wittry, Pasadena, Calif.

[73] Assignee: Rockwell International Corporation, El Segundo, Calif.

[21] Appl. No.: 905,484

[22] Filed: May 12, 1978

[51] Int. Cl.$^2$ .............................................. H01J 37/00
[52] U.S. Cl. .................................. 250/492 A; 250/398
[58] Field of Search ............... 250/492 A, 492 B, 398, 250/396, 423, 505; 219/121 EB, 121 EM

[56] References Cited

U.S. PATENT DOCUMENTS

| | | | |
|---|---|---|---|
| 3,717,785 | 2/1973 | Guernet | 250/492 A |
| 3,743,842 | 7/1973 | Smith et al. | 250/492 A |
| 3,886,367 | 5/1975 | Castle | 250/505 |
| 3,947,687 | 3/1976 | Fenstermacher | 250/492 A |
| 4,124,802 | 11/1978 | Terasawa et al. | 250/492 A |

Primary Examiner—Bruce C. Anderson
Attorney, Agent, or Firm—H. Fredrick Hamann; Wilfred G. Caldwell

[57] ABSTRACT

There is described an apparatus for use in high resolution lithographic techniques. The apparatus includes a microchannel array plate for providing a large area electron source with small divergence angle. The electrons can be used directly, in transmission electron lithography, or as a source for producing x-rays for x-ray lithography. The microchannel array plate is used to control the divergence angle of the electrons (especially in the transmission electron lithography technique) as well as the x-rays (in x-ray lithography techniques). That is, in the x-ray lithography technique the microchannel array plate collimates x-rays which are generated in response to electrons striking a suitable source.

13 Claims, 3 Drawing Figures

LITHOGRAPHIC APPARATUS

BACKGROUND OF THE INVENTION

1. Field of the Invention

The invention is used, generally, in lithiographic techniques and, particularly, in lithographic techniques using electrons directly or as a means for generating x-rays.

2. Prior Art

There are many known techniques for establishing fine-line lithography. There is also much known apparatus available in the art for performing the appropriate techniques. The apparatus frequently includes a source of electrons for direct use or for creating x-rays, a mask arrangement and a utilization device such as a substrate with resist thereon. Various techniques are provided to control the resolution of the apparatus. Typical of such devices are electron projection systems, contact mask arrangements and the like. For the most part, however, these devices are extremely complex and/or expensive in order to obtain a high degree of resolution.

SUMMARY OF THE INVENTION

This invention relates to an apparatus for performing lithographic techniques which includes a microchannel array plate for producing a broad electron beam and for controlling the direction of electrons and/or x-rays to be used in lithographic techniques. The microchannel array plate includes a layer which contains radioactive material which causes electrons to be emitted at one side of the microchannel array plate. The electrons are multiplied by the conventional operation of the microchannel array plate. Appropriate apparatus is used with the microchannel array plate to establish transmission electron lithography or x-ray lithography as the case may be. The additional apparatus includes appropriate potential sources for accelerating electrons, a target area for producing x-rays especially for x-ray lithography), a suitable mask and the appropriate substrate.

DESCRIPTION OF A PREFERRED EMBODIMENT

Figure 1:
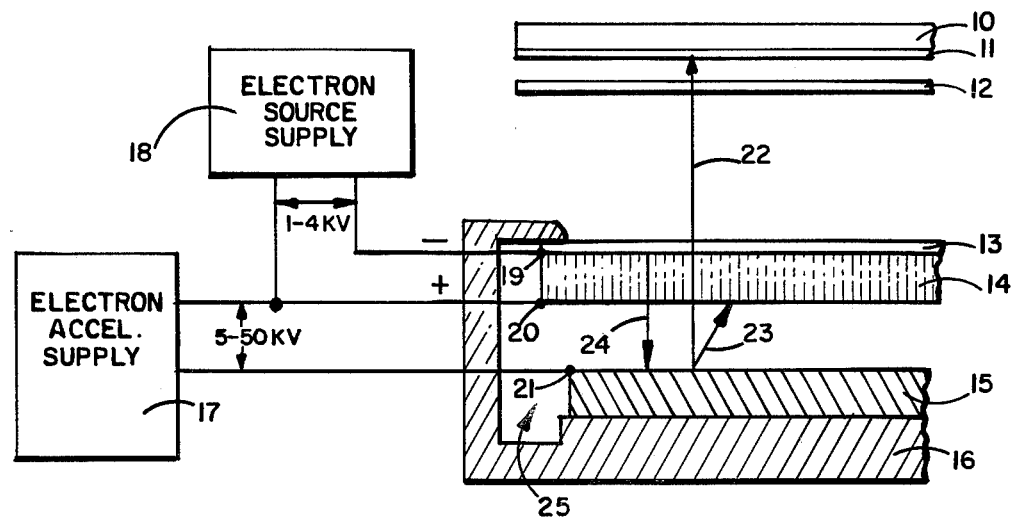
FIG. 1 is a schematic diagram, partially in section, of a system primarily used for x-ray lithography in accordance with the present invention.

Referring now to FIG. 1, there is shown a schematic representation of an apparatus which is useful in x-ray lithography. Initially, a suitable substrate 10 with a layer 11 of resist or the like thereon is provided. Mask 12 is disposed adjacent to the utilization area (substrate 10 and resist layer 11) to define the pattern which is to be established in the resist layer. Microchannel array plate 14 (see also FIG. 2) includes thin layer 13 of radioactive material thereon. Layer 13 may be a deposited layer on a suitable film, a separate plate or the like. In fact, layer 13 may be any suitable material which selectively emits electromagnetic radiation or energetic particles which causes array plate 14 to produce electrons. A suitable target 15 is provided to act as a source of x-ray radiation. A suitable jig or support apparatus 16 is provided to support target 15 as well as plate 14 and radioactive layer 13. Typically, jig 16 is a closed apparatus which is arranged so that volume 25 can be substantially evacuated. An electron accelerating supply source 17 typically provides a potential of five to fifty KV and is connected between terminal 21 at target 15 and terminal 20 at the lower or inner surface of plate 14. Electron source supply 18 typically provides a potential of one to four KV and is connected between terminal 20 and terminal 19 which is connected to the upper surface of plate 14.

Figure 2:
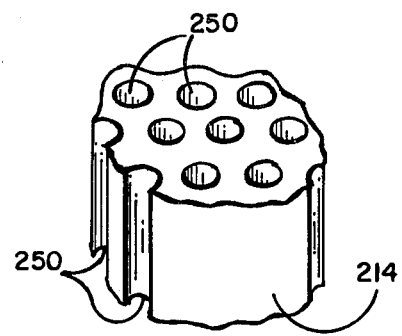
FIG. 2 is a perspective view of a portion of a microchannel array plate device for use with the present invention.

Reference is now made to FIG. 2 which is a perspective view of a portion 214 of plate 14 which is known in the art and frequently referred to as a microchannel array plate. Plate portion 214 includes a plurality of holes or apertures 250 which pass completely therethrough between the upper and the lower surfaces respectively. Some of the apertures 250 are shown in cutaway view. Others are shown only in a top view. It should be understood that the apertures, typically, represent approximately 60% or more of the total area of the major surfaces. Moreover, the aspect ratio of each aperture is preferably about 50:1. That is, the length of the apertures is approximately 50 times as long as the diameter. Thus, a relatively very long, narrow tube or channel is provided. Consequently, any radiation charged particles, particulate matter or the like which enters one end of aperture 250 has a very narrow range of angular deflection at the opposite or emergent end of the aperture. Consequently, substantial directionality of the elements can be controlled.

Referring now to FIGS. 1 and 2, it is clear that electrons (or other charged particles) are provided by radioactive source layer 13. The electrons or other charged particles from the source generate secondary electrons, these are accelerated within the channels and, on striking the walls of the channels, generate more secondary electrons. The number of electrons so produced is a function of the voltage across plate 14. The electrons have a very narrow range of divergence when they are emitted at the inner surface of plate 14.

The electrons emerge from plate 14 and impinge upon target 15 thereby causing the generation of x-rays. X-rays can follow the paths such as suggested by trajectories 22 or 23 when emitted from target 15. However, because of the nature of plate 14, x-rays which follow trajectory 23 are repelled, blocked or absorbed by plate 14. Conversely, x-rays which follow trajectory 22 will pass through apertures 250 in plate 14 and be utilized in the lithographic technique. That is, these x-rays will pass through mask 12 (in accordance with the pattern thereon) and strike resist layer 11 to form the pattern which is desired. Inasmuch as the path defined by trajectory 22 is substantially normal to the surface of substrate 10 and resist 11, the pattern defined by mask 12 is very faithfully reproduced. That is, the scattering or divergence angle of the x-rays produced by target 15 is minimized.

Figure 3:
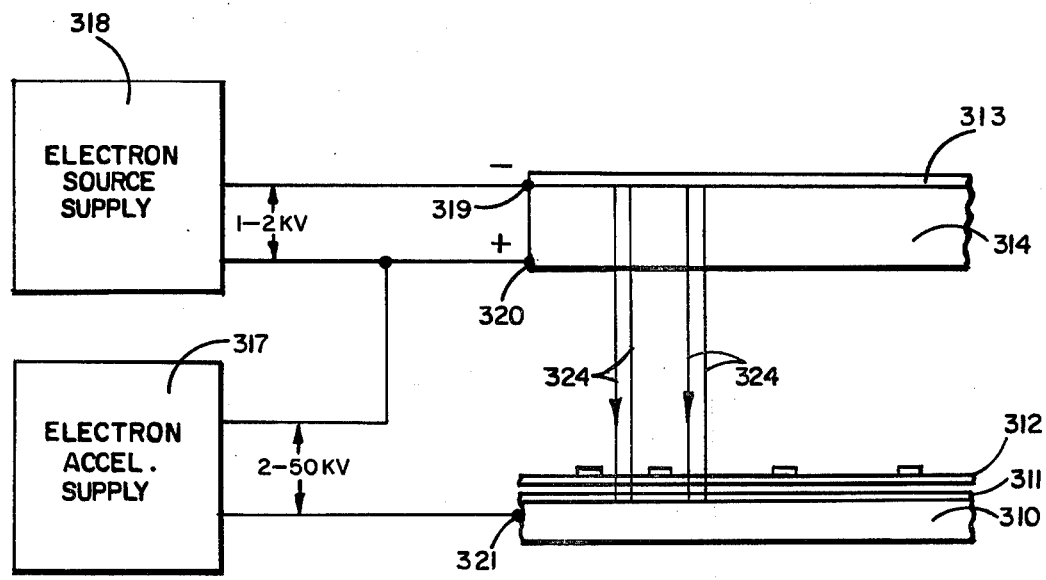
FIG. 3 is a schematic representation of an apparatus in accordance with the present invention and especially useful in transmission electron lithography.

Referring now to FIG. 3, there is shown a schematic representation of the apparatus of the present invention when used in the transmission electron lithography (TEL) operation. In this operation, similar elements bear similar reference numerals except that the initial digit is 3. For example, radioactive layer 313 corresponds to radioactive layer 13 of FIG. 1. Radioactive layer 313 is disposed on plate 314 which has similar configuration and characteristics to the plate shown in FIGS. 1 and 2. In response to the electron souce supply voltage applied from source 318 to terminals 319 and 320, electrons are supplied from radioactive layer 313 to plate 314.

In response to the electron accelerating supply potential supplied by source 317 to terminals 320 and 321, electrons following trajectory 324 are produced and accelerated toward substrate 310. The electrons pass through mask 312 which may be of the type similar to a mask shown and described in a commonally assigned, co-pending application, "High Resolution Mask and Method of Fabrication Thereof" by A. B. Jones, Filed 6/27/77, Ser. No. 810,469, now abandoned. The electrons impinge upon resist 311 to form a pattern therein which pattern is defined by mask 312. Again, because the transverse energy of the electrons is small on leaving the plate 314, electrons which follow trajectories 324 are projected substantially normally to substrate 310 thereby enhancing the pattern resolution so that finer patterns and fine-line lithography techniques are established.

Thus, there has been shown and described an apparatus and method for producing fine-line lithography patterns on a workpiece or utilization device. In particular, the apparatus provides a large area, uniform, collimated beam of electrons or x-rays for lithographic techniques. The patterns which are produced are of extremely fine line resolution. The various voltages and the like which are suggested are illustrative only and are not intended to be limitative. It is understood that those skilled in the art might conceive modifications which fall within the purview of this description. However, any such modifications, changes or variations are intended to be included within the scope of the description. The description is intended to be illustrative only and not to be limitative. The scope of the application is determined only by the claims appended hereto.

Having thus described the preferred embodiment of the invention, what is claimed is:

1. Apparatus for high resolution lithography comprising,
   source means for supplying energetic charged particles,
   microchannel array plate means for collimating said charged particles into a prescribed beam path,
   said source means comprising a layer on said microchannel array plate,
   mask means, and
   utility means disposed to receive and be responsive to energy produced by said charged particles which pass through said mask means as part of said beam path.

2. The apparatus recited in claim 1 including
   potential source means for providing a potential difference between said utility means and said plate means to cause acceleration of said charged particles toward said utility means.

3. The apparatus recited in claim 1 including
   supply means for providing a potential difference between said source means and said plate means to enhance the production of said energetic charged particles.

4. The apparatus recited in claim 1 wherein
   said microchannel array plate means comprises a plate having a plurality of apertures therethrough, said apertures having a small diameter relative to the thickness of said plate whereby a high aspect ratio of thickness to diameter is achieved.

5. The apparatus recited in claim 1 including
   target means located adjacent said plate means to receive said energetic charged particles and to produce other radiation as a result of receiving said energetic charged particles.

6. The apparatus recited in claim 5 wherein
   said target means is disposed so as to direct said other radiation to said utility means through said plate means.

7. The apparatus recited in claim 5 wherein
   said energetic charged particles comprise electrons and said other radiation comprises x-rays.

8. The apparatus recited in claim 4 wherein
   said apertures comprises at least 50% of the surface area of said plate means normal to said beam path.

9. The apparatus recited in claim 1 wherein
   said utility means comprises a resist coated substrate.

10. The apparatus recited in claim 1 wherein
    said mask is transparent to said energetic particles except at certain opaque areas.

11. The apparatus recited in claim 5 including
    a vacuum chamber between said target means and said plate means.

12. The apparatus recited in claim 1 wherein
    said source means comprises a relatively thin layer of radioactive material.

13. The apparatus recited in claim 5 wherein
    said plate means is disposed between said utility means and said target means.

* * * * *